US010038060B2

(12) United States Patent
Lee et al.

(10) Patent No.: US 10,038,060 B2
(45) Date of Patent: Jul. 31, 2018

(54) GRAPHENE NMOS TRANSISTOR USING NITROGEN DIOXIDE CHEMICAL ADSORPTION

(71) Applicant: QUALCOMM Incorporated, San Diego, CA (US)

(72) Inventors: Yong Ju Lee, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/158,653

(22) Filed: May 19, 2016

(65) Prior Publication Data

US 2017/0338311 A1    Nov. 23, 2017

(51) Int. Cl.
*H01L 29/16* (2006.01)
*H01L 21/02* (2006.01)
(Continued)

(52) U.S. Cl.
CPC ...... *H01L 29/1606* (2013.01); *H01L 21/0272* (2013.01); *H01L 21/0273* (2013.01);
(Continued)

(58) Field of Classification Search
CPC ........... H01L 29/1606; H01L 21/02112; H01L 21/02378; H01L 21/02527; H01L 21/0272;
(Continued)

(56) References Cited

U.S. PATENT DOCUMENTS 8,106,383 B2    1/2012  Jenkins et al.
8,344,358 B2    1/2013  Avouris et al.
(Continued)

FOREIGN PATENT DOCUMENTS

WO    2008156583 A1    12/2008

OTHER PUBLICATIONS

Lin, Y.-M., et al., 100-GHz Transistors from Wafer-Scale Epitaxial Graphene, Science Magazine, Feb. 5, 2010, p. 662, vol. 327.

*Primary Examiner* — Stephen Bradley
*Assistant Examiner* — Patricia Reddington
(74) *Attorney, Agent, or Firm* — Muncy, Geissler, Olds & Lowe, P.C.

(57) ABSTRACT

An n-type metal-oxide-semiconductor (NMOS) transistor comprises a graphene channel with a chemically adsorbed nitrogen dioxide ($NO_2$) layer formed thereon. The NMOS transistor may comprise a substrate having a graphene layer formed thereon and a gate stack formed on a portion of the graphene layer disposed in a channel region that further includes a spacer region. The gate stack may comprise the chemically adsorbed $NO_2$ layer formed on the graphene channel, a high-k dielectric formed over the adsorbed $NO_2$ layer, a gate metal formed over the high-k dielectric, and spacer structures formed in the spacer region. The adsorbed $NO_2$ layer formed under the gate and the spacer structures may therefore attract electrons from the graphene channel to turn the graphene-based NMOS transistor off at a gate voltage ($V_g$) equal to zero, making the graphene-based NMOS transistor suitable for digital logic applications.

12 Claims, 15 Drawing Sheets

(51) Int. Cl.
- *H01L 29/66* (2006.01)
- *H01L 29/51* (2006.01)
- *H01L 29/786* (2006.01)
- *H01L 29/08* (2006.01)
- *H01L 29/10* (2006.01)
- *H01L 23/535* (2006.01)
- *H01L 21/04* (2006.01)
- *H01L 21/027* (2006.01)

(52) U.S. Cl.
CPC .. *H01L 21/02112* (2013.01); *H01L 21/02378* (2013.01); *H01L 21/02527* (2013.01); *H01L 21/044* (2013.01); *H01L 23/535* (2013.01); *H01L 29/0847* (2013.01); *H01L 29/1033* (2013.01); *H01L 29/513* (2013.01); *H01L 29/518* (2013.01); *H01L 29/66045* (2013.01); *H01L 29/6653* (2013.01); *H01L 29/66742* (2013.01); *H01L 29/78684* (2013.01)

(58) Field of Classification Search
CPC . H01L 21/0273; H01L 21/044; H01L 23/535; H01L 29/0847; H01L 29/513; H01L 29/518; H01L 29/66045; H01L 29/6653; H01L 29/66742; H01L 29/78684; H01L 29/1033
USPC .......................................................... 257/29
See application file for complete search history.

(56) References Cited

U.S. PATENT DOCUMENTS

| | | | |
|---|---|---|---|
| 8,778,782 B2 | 7/2014 | Lippert et al. | |
| 2010/0320437 A1* | 12/2010 | Gordon | B82Y 10/00 257/9 |
| 2011/0220865 A1* | 9/2011 | Miyata | B82Y 10/00 257/12 |
| 2012/0056161 A1* | 3/2012 | Avouris | H01L 29/1606 257/24 |
| 2012/0132885 A1* | 5/2012 | Lippert | B82Y 10/00 257/9 |
| 2016/0126317 A1* | 5/2016 | Kim | H01L 29/1606 257/29 |
| 2017/0077301 A1* | 3/2017 | Pawlak | H01L 29/7848 |

* cited by examiner

GRAPHENE NMOS TRANSISTOR USING NITROGEN DIOXIDE CHEMICAL ADSORPTION

TECHNICAL FIELD

The various aspects and embodiments described herein generally relate to transistors suitable for digital logic applications, and in particular, to a graphene n-type metal-oxide-semiconductor (NMOS) transistor with chemically adsorbed nitrogen dioxide ($NO_2$) in a channel region.

BACKGROUND

Graphene is a carbon allotrope and represents the basic structural element of all other carbon allotropes, including graphite, charcoal, diamond, etc. In general, as shown in FIG. 1, graphene has a two-dimensional, atomic-scale structure in which carbon atoms are arranged in a regular hexagonal pattern with one carbon atom forming each vertex. Graphene has several extraordinary properties, including a strength substantially greater than steel, the ability to efficiently conduct heat and electricity, reported electron mobilities greater than 15,000 $cm^2/Vs$, as well as being the only known solid material in which every atom is available for chemical reaction from two sides due to the two-dimensional structure. As such, graphene can be considered the thinnest electronic material, merely one atom thick and nearly transparent with very high carrier mobilities, whereby graphene should enable transistors operating at very high frequencies. For example, FIG. 2A depicts a top-gated field-effect transistor (FET) fabricated on a two-inch graphene wafer, with graphene epitaxially formed on a silicon (Si) face of a semi-insulating, high-purity silicon carbide (SiC) wafer through thermal annealing at 1450 degrees Celsius. As shown in FIG. 2B, the top-gated graphene FET shown in FIG. 2A demonstrated a 53 GHz cutoff frequency for a 550 nanometer (nm) gate and a cutoff frequency as high as 100 GHz for a 240 nm gate at $V_d$=2.5V. However, as shown in FIG. 2C, the top-gated graphene FET shown in FIG. 2A cannot turn the transistor off at a gate voltage ($V_g$) between −3V and 3V due to the absence of a band gap in graphene, meaning that the top-gated graphene FET shown in FIG. 2A is not suitable for digital logic applications due to the substantial source-to-drain current.

Accordingly, because a graphene FET must have the ability to turn the transistor off at a gate voltage between −3V and 3V to enable use in digital logic applications, the existing graphene FET results that are known to-date are all limited to analog chips. One option to capture electrons in a graphene channel may comprise p-type doping, which refers to a process to intentionally introduce impurities into an extremely pure material (such as graphene) in order to modulate the electrical properties associated therewith. For example, FIG. 3 illustrates an exemplary transistor structure 10 that employs p-type doping to introduce nitrogen impurities 22, 24, 26, into a graphene channel 14 and thereby create deficiencies in valence electrons called "holes" in an attempt to capture electrons in the graphene channel 14. As such, the nitrogen impurities 22, 24, 26 introduced into the graphene channel 14 causes some electrons that flow from a source 12 to a drain 16 to scatter, as depicted at 32, 34, 36, while other electrons flow through the channel undisturbed, as depicted at 38. Accordingly, although p-type doping may be an option to capture electrons in the transistor channel 14, empirical graphene FET simulations show that electron mobility drops from ~1330 $cm^2/Vs$ to ~250 $cm^2/Vs$ with p-type doping (i.e., about a 5× current decrease), which still does not provide sufficient performance benefits to realize digital logic applications. As such, the semiconductor industry has still not found a way to give graphene the important bandgap required to fabricate digital logic, and thus graphene-based processors.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to various aspects, the present disclosure generally relates to a graphene n-type metal-oxide-semiconductor (NMOS) transistor that can be applied to digital logic technologies through using nitrogen dioxide ($NO_2$) chemical adsorption in a channel region. More particularly, because chemically adsorbed $NO_2$ can act as a strong electron acceptor on graphene, the $NO_2$ layer can attract electrons from the graphene channel such that the graphene becomes electron-deficient and creates bandgap energy in the channel region. As such, with an n-type source and an n-type drain, an N(source)-P(channel)-N(drain) transistor can be formed, wherein the N-P-N transistor can turn off at a gate voltage ($V_g$) equal to zero, which may dramatically decrease an off current ($I_{off}$) and make the graphene-based NMOS transistor suitable for digital logic applications. Furthermore, in various embodiments, the graphene channel may have a doping concentration ($N_D$) equal to zero, which may maximize electron mobility through the graphene channel and provide high frequency transport to increase a ration between off current ($I_{off}$) and on current ($I_{on}$). Furthermore, the chemically adsorbed $NO_2$ may provide a buffer layer to prevent damage to the graphene layer during high-k deposition and cause minimal scattering or other disruption to the lattice structure in the graphene channel. Accordingly, the graphene NMOS transistor may experience high frequency transport (performance) and low $I_{off}$ leakage current (power).

According to various aspects, an n-type metal-oxide-semiconductor (NMOS) transistor may comprise a substrate having a graphene layer formed on a topmost surface, a source terminal formed on the graphene layer in a source region, a drain terminal formed on the graphene layer in a drain region, a gate stack formed on the graphene layer within a channel region disposed between the source terminal and the drain terminal, wherein the channel region may comprise a spacer region and the gate stack may comprise an adsorbed nitrogen dioxide ($NO_2$) layer disposed above the graphene layer in the channel region between the source terminal and the drain terminal and further between the spacer region and the graphene layer, a high-k dielectric formed over the adsorbed $NO_2$ layer, and a gate metal formed over the high-k dielectric. As such, in various embodiments, the adsorbed $NO_2$ layer may attract electrons from the graphene layer within the channel region to make the graphene layer electron-deficient in the channel region, thereby making the electron-deficient graphene layer in the channel region and forming an N-P-N transistor that has substantially no leakage current at a gate voltage ($V_g$) equal to zero. Furthermore, in various embodiments, the graphene layer has a doping concentration ($N_D$) equal to zero such that electron mobility ($\mu_n$) through the graphene layer is maximized and the N-P-N transistor has a ratio between an on current ($I_{on}$) and on off current ($I_{off}$) suitable for digital logic applications, while forming spacers in the spacer region with the adsorbed $NO_2$ layer disposed under the spacers may reduce potential short-channel effects.

According to various aspects, a method for forming an NMOS transistor may comprise forming a graphene layer on a substrate surface, forming an adsorbed nitrogen dioxide layer on a portion of the graphene layer disposed in a channel region, forming a gate stack on a portion of the adsorbed nitrogen dioxide layer, forming spacer structures on the adsorbed nitrogen dioxide layer in spacer regions disposed within the channel region and adjacent to the gate stack, and forming a source stack and a drain stack on lateral portions of the graphene layer disposed adjacent to the adsorbed nitrogen dioxide layer. Furthermore, in various embodiments, the substrate surface may comprise a silicon (Si)-terminated face having the graphene layer epitaxially formed thereon, whereby the epitaxially formed graphene layer may have a homogeneous lattice structure and a doping concentration ($N_D$) equal to zero.

According to various aspects, a field-effect transistor may comprise a source, a drain, a gate, and a graphene channel having an adsorbent surface with a nitrogen dioxide adsorbate film under the gate and on the adsorbent surface. Furthermore, the field-effect transistor may comprise means for flowing electrons through the graphene channel, wherein the nitrogen dioxide adsorbate film may be configured to attract the electrons flowed through the graphene channel such that the field-effect transistor turns off at a gate voltage ($V_g$) equal to zero and the graphene channel may have a doping concentration ($N_D$) equal to zero such that the electrons flowed through the graphene channel have a maximum possible mobility ($\mu$). In various embodiments, the field-effect transistor may additionally comprise a first spacer structure located in a first spacer region above the nitrogen dioxide adsorbate film and between the source and the gate and a second spacer structure located in a second spacer region above the nitrogen dioxide adsorbate film and between the drain and the gate, wherein having the nitrogen dioxide adsorbate film located under the spacers may reduce potential short-channel effects (e.g., leakage current related to drain-induced barrier lowering (DIBL)).

According to various aspects, a method for operating a field-effect transistor comprising a source, a drain, a gate, and a graphene channel having an adsorbent surface with a nitrogen dioxide adsorbate film under the gate and on the adsorbent surface may comprise flowing electrons from the source to the drain and through the graphene channel, wherein the graphene channel has a doping concentration ($N_D$) equal to zero such that the flowed electrons have a maximum possible mobility ($\mu$), and applying a gate voltage ($V_g$) to the field-effect transistor, wherein the nitrogen dioxide adsorbate film located under the gate may attract the electrons flowed through the graphene channel such that the field-effect transistor turns off at $V_g$ equals zero.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of the various aspects and embodiments described herein and many attendant advantages thereof will be readily obtained as the same becomes better understood by reference to the following detailed description when considered in connection with the accompanying drawings which are presented solely for illustration and not limitation, and in which.

DETAILED DESCRIPTION

Various aspects and embodiments are disclosed in the following description and related drawings to show specific examples relating to exemplary aspects and embodiments. Alternate aspects and embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein describes particular embodiments only and should not be construed to limit any embodiments disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

Figure 1:
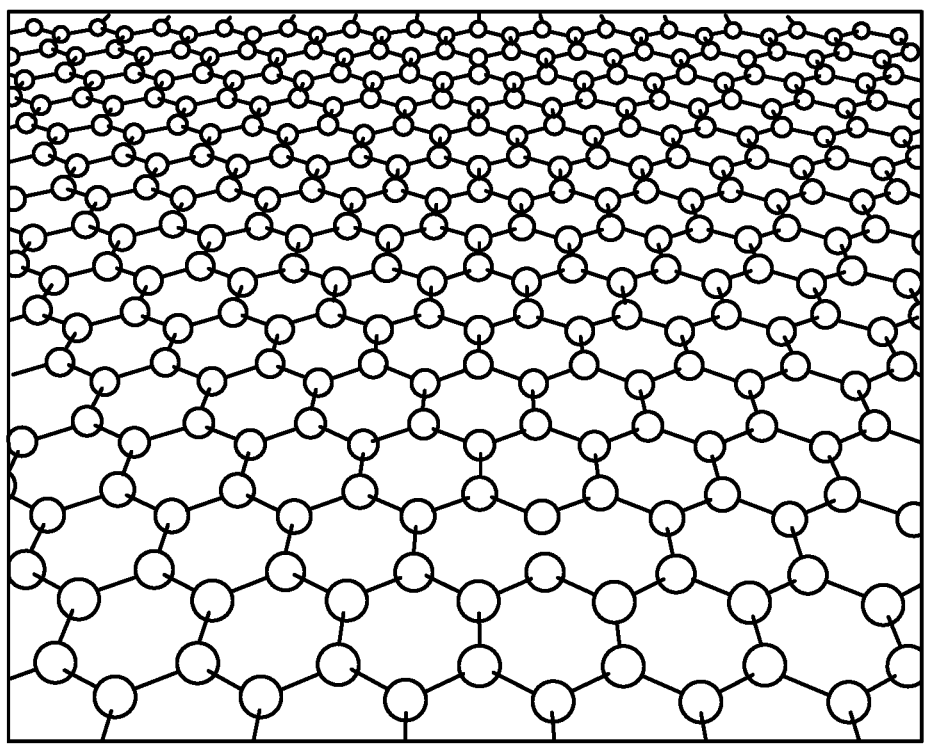
FIG. 1 illustrates an exemplary graphene structure, according to various aspects.
Figure 2A:
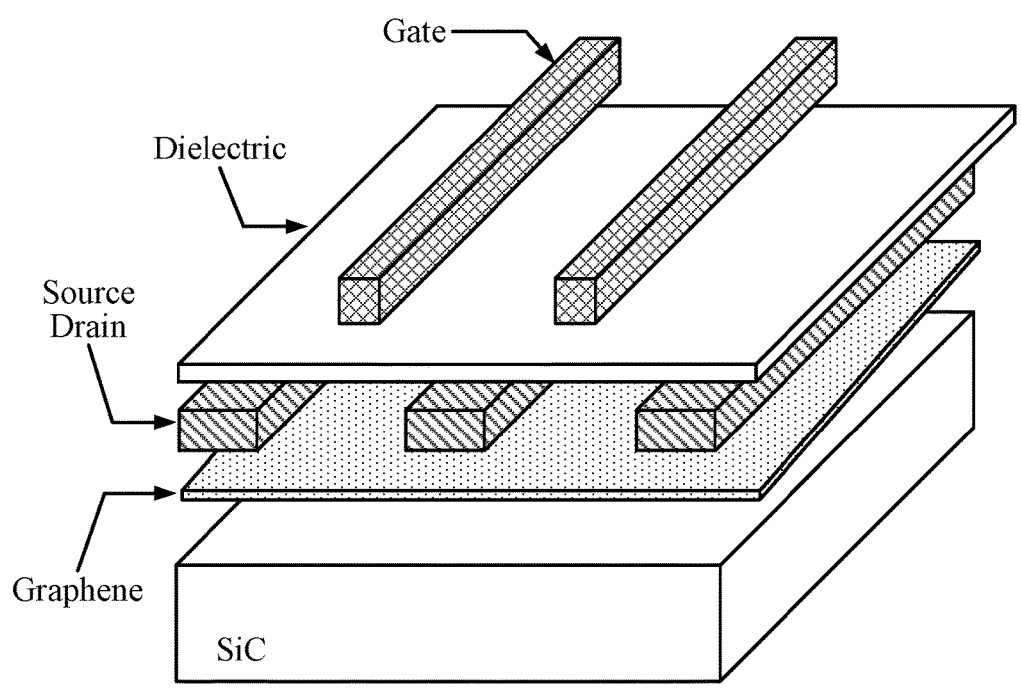
FIG. 2A illustrates an exemplary top-gated field-effect transistor fabricated on a graphene wafer and FIG. 2B-2C illustrate performance measurements associated with the top-gated field-effect transistor shown in FIG. 2A, according to various aspects.
Figure 2B:
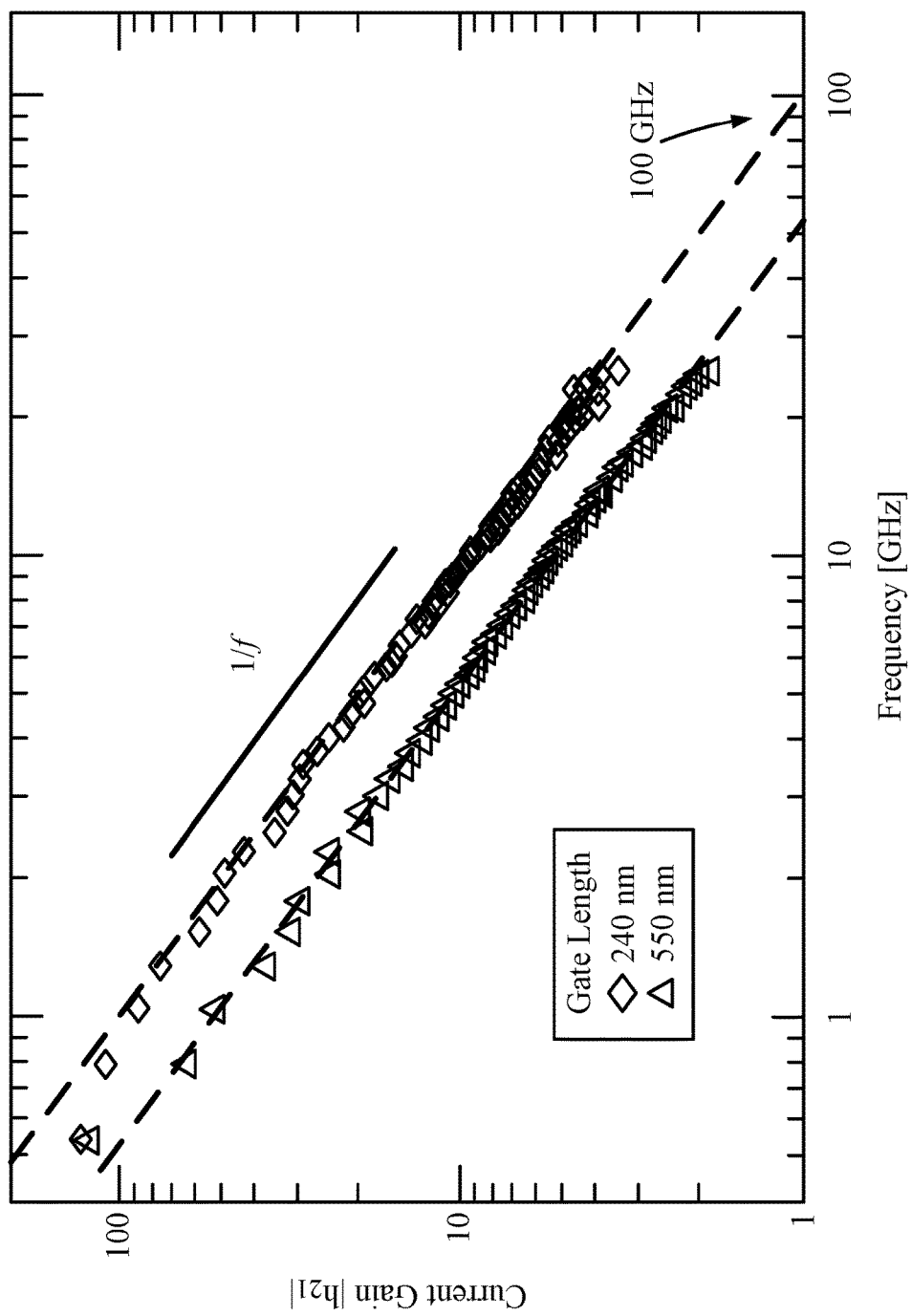
Figure 2C:
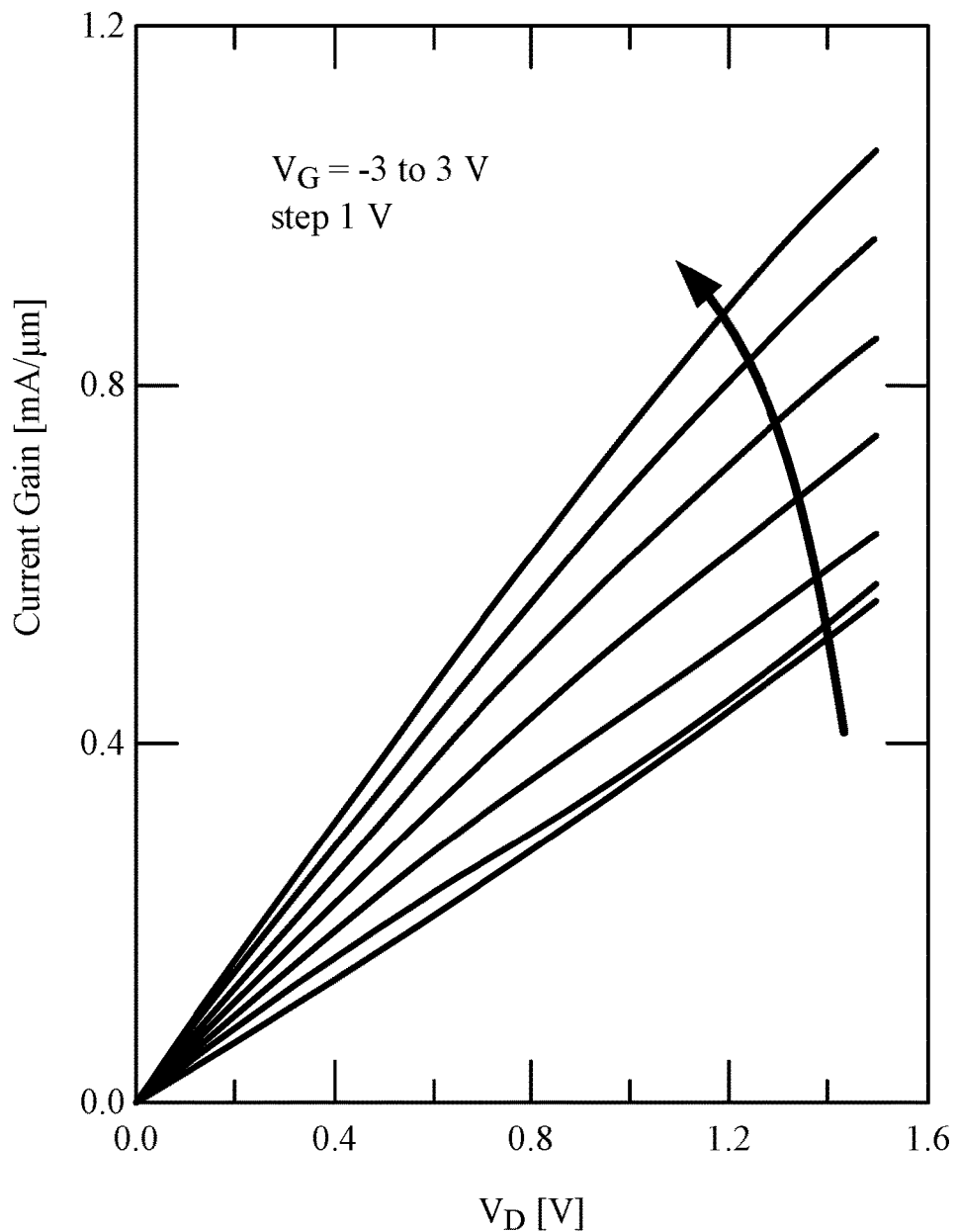
Figure 3:
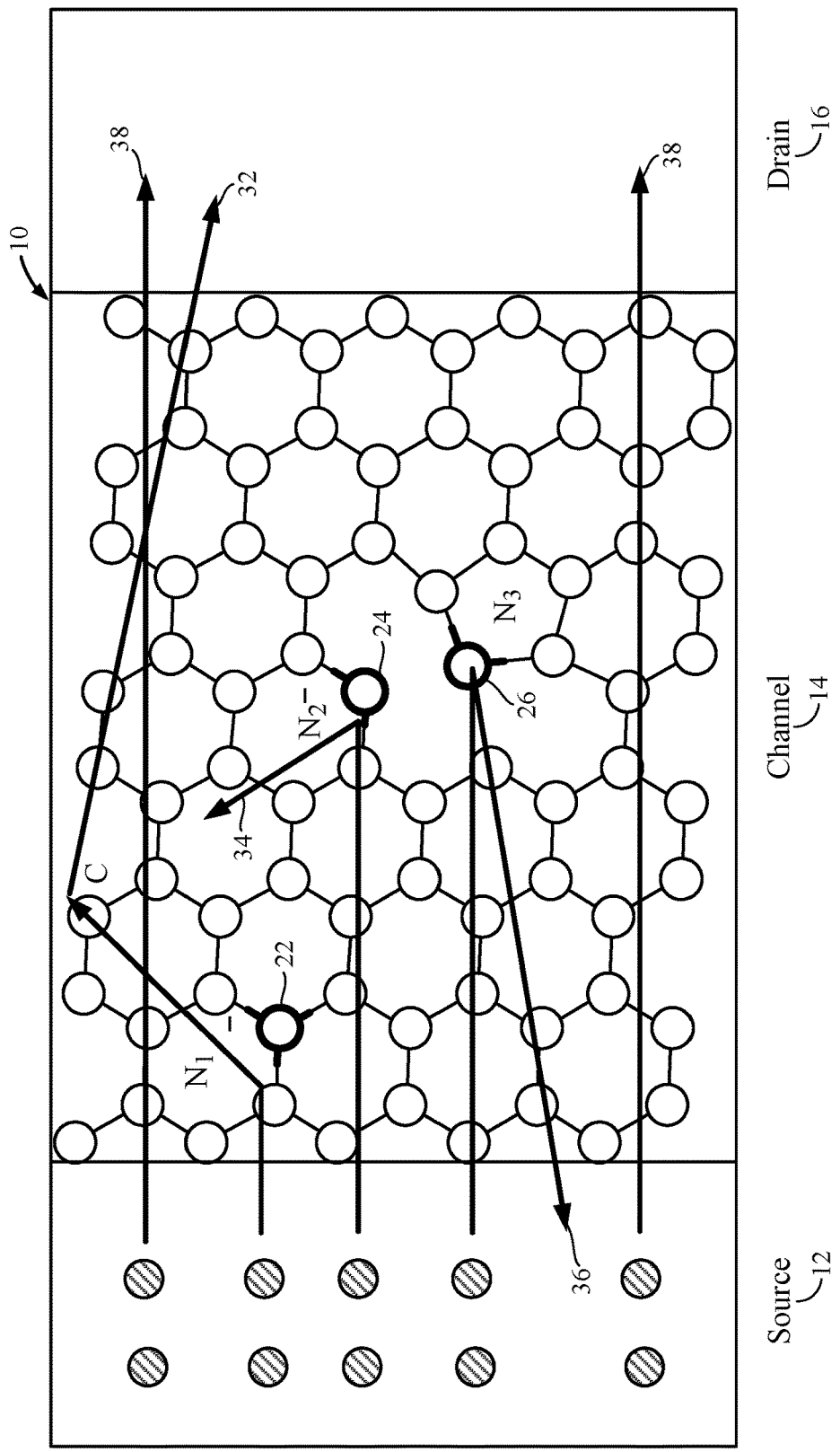
FIG. 3 illustrates an exemplary transistor structure that employs p-type doping in an attempt to capture electrons in a graphene channel, according to various aspects.

As used herein, the term "graphene" may refer to a sheet-like material having a two-dimensional, atomic-scale structure in which carbon atoms are arranged in a regular hexagonal pattern with one carbon atom forming each vertex (e.g., as shown in FIG. 1).

As used herein, the term "adsorption" (or "chemical adsorption") and variants thereof may refer to a process whereby atoms, ions, molecules, and/or another suitable gas, liquid, and/or dissolved solid substance may be adhered to a surface, thereby creating an "adsorbate" film on an "adsorbent" surface. In that sense, "adsorption" differs from "absorption" in that the latter refers to processes whereby atoms, ions, molecules, and/or other suitable substances are permeates or otherwise enters another substance (e.g., a chemical reaction or physical process such as salt dissolving in water).

Figure 4:
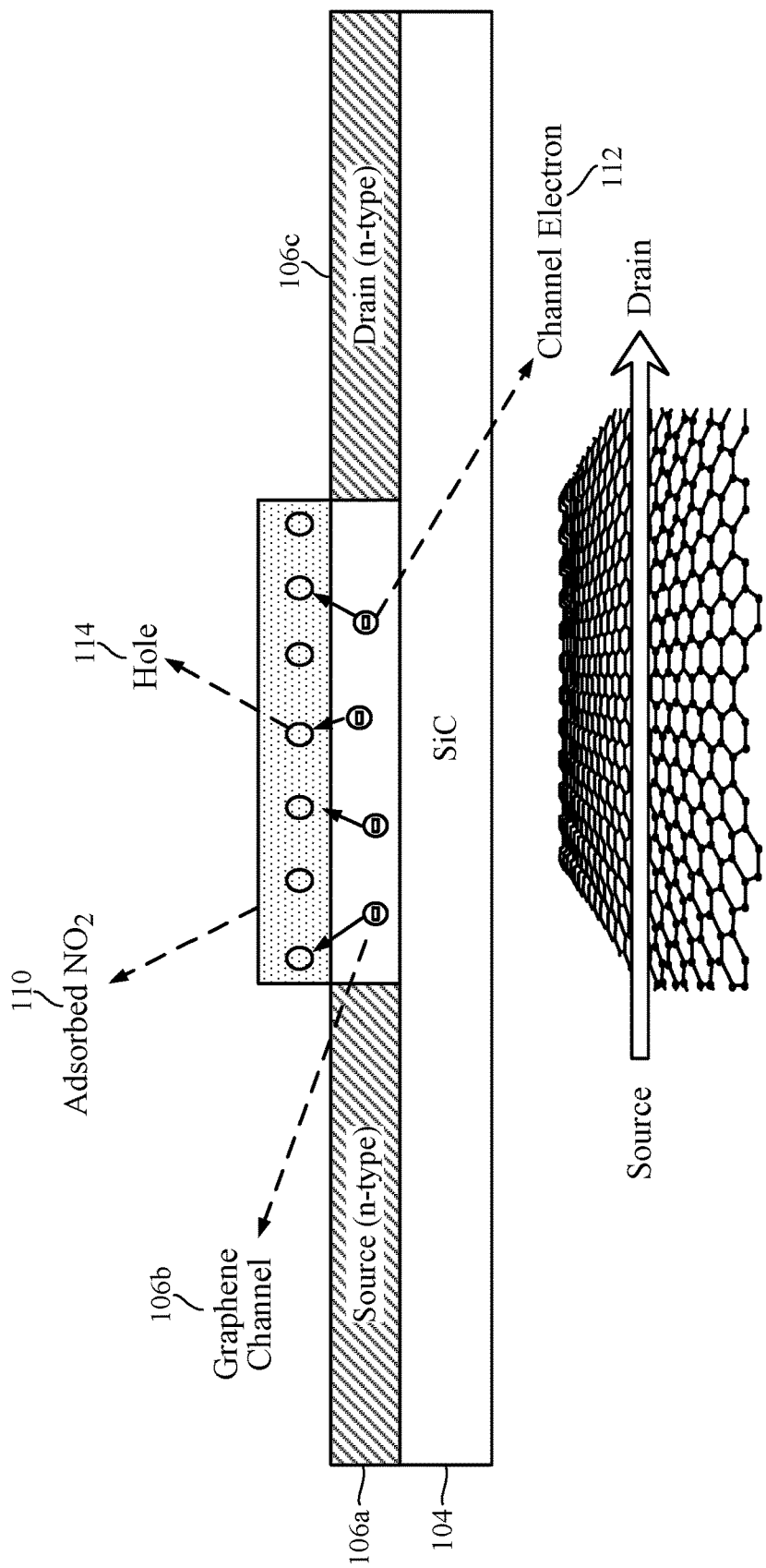
FIG. 4 illustrates an exemplary graphene n-type metal-oxide-semiconductor (NMOS) transistor formed using nitrogen dioxide ($NO_2$) chemical adsorption in a channel region, according to various aspects.

According to various aspects, as will be described in further detail herein, FIG. 4 illustrates an exemplary graphene n-type metal-oxide-semiconductor (NMOS) transistor that has a chemically adsorbed nitrogen dioxide ($NO_2$) layer 110 disposed in a channel region 106$b$ above a graphene layer formed on a silicon carbide (SiC) substrate 104. As such, because nitrogen has five electrons in an outer shell and therefore one unpaired electron, the chemically adsorbed $NO_2$ layer 110 may have valence electron deficiencies called "holes" 114 that can attract channel electrons 112 from the graphene channel 106. As such, according to various embodiments, the chemically adsorbed $NO_2$ layer 110 can provide a strong electron acceptor to attract the channel electrons 112 from the graphene channel 106, thereby making the graphene channel 106$b$ electron-deficient and creating bandgap energy in the graphene channel region 106$b$. As such, with an n-type source 106$a$ and an n-type drain 106$c$ further formed from graphene, an N(source)-P(channel)-N(drain) transistor that turns off at a gate voltage ($V_g$) equal to zero can be formed, thus dramatically decreasing off current ($I_{off}$) and increasing an off current-to-on current ratio ($I_{on}/I_{off}$). Furthermore, the chemically adsorbed $NO_2$ layer 110 may provide a buffer layer to prevent damage to the graphene layer 106$a$, 106$b$, 106$c$ that may otherwise occur during processes to deposit high-k dielectrics (not shown) and cause minimal scattering or other disruption to the lattice structure in the graphene channel 106$b$. As such, according to various aspects, the graphene NMOS transistor shown in FIG. 4 may experience high frequency transport (performance) and low off leakage current (power). Furthermore, with electron mobility ($\mu_n$) defined according to the following formula, where $N_D$ refers to a doping concentration, the graphene NMOS transistor shown in FIG. 4 may have the highest possibility electron mobility (i.e., 1330 cm$^2$/Vs) because no doping is used in the graphene channel 106$b$ such that $N_D$=0:

$$\mu_n(N_D) = 65 + \frac{1265}{1 + \left(\frac{N_D}{8.5 \times 10^{16}}\right)^{.72}}$$

Figure 5:
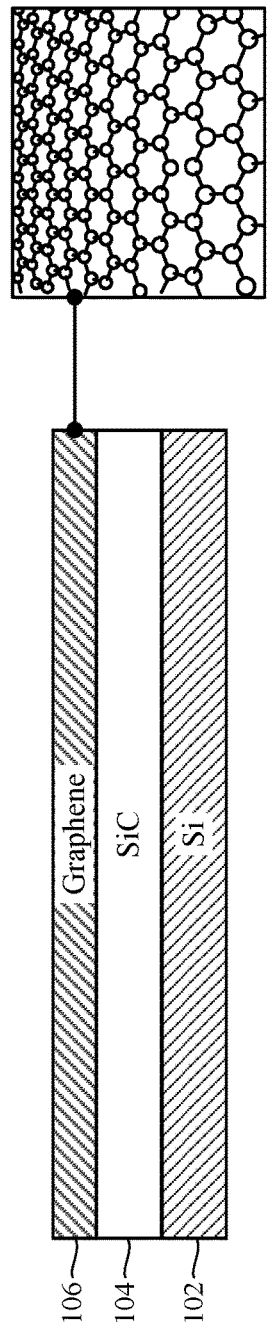
FIG. 5 through FIG. 16 illustrate an exemplary process flow to form a graphene NMOS transistor using $NO_2$ chemical adsorption, according to various aspects.

According to various aspects, with reference to FIG. 5 through FIG. 16, an exemplary process to form or otherwise fabricate a graphene NMOS transistor using $NO_2$ chemical adsorption will be described. More particularly, as shown in FIG. 5, a graphene layer 106 can be formed on a silicon substrate 102 that has a silicon carbide (SiC) surface 104. In various embodiments, the graphene layer 106 may be epitaxially formed on the SiC surface 104 through thermal annealing at high temperatures (e.g., 1450 degrees Celsius) in a high vacuum or an inert gas atmosphere. For example, the SiC surface 104 used to epitaxially grow the graphene layer 106 contains Si-terminated and C-terminated faces, whereby homogeneous and clean graphene can be grown on the Si face with carrier mobilities that can reach high levels. Accordingly, in various embodiments, the graphene layer 106 may be epitaxially formed on the Si face in order to form the graphene layer 106 with a homogeneous and clean lattice structure that may enable greater carrier mobilities. However, those skilled in the art will appreciate that any suitable technique may be used to form the graphene layer 106 on the SiC surface 104 to suit different applications and/or needs.

Figure 6:
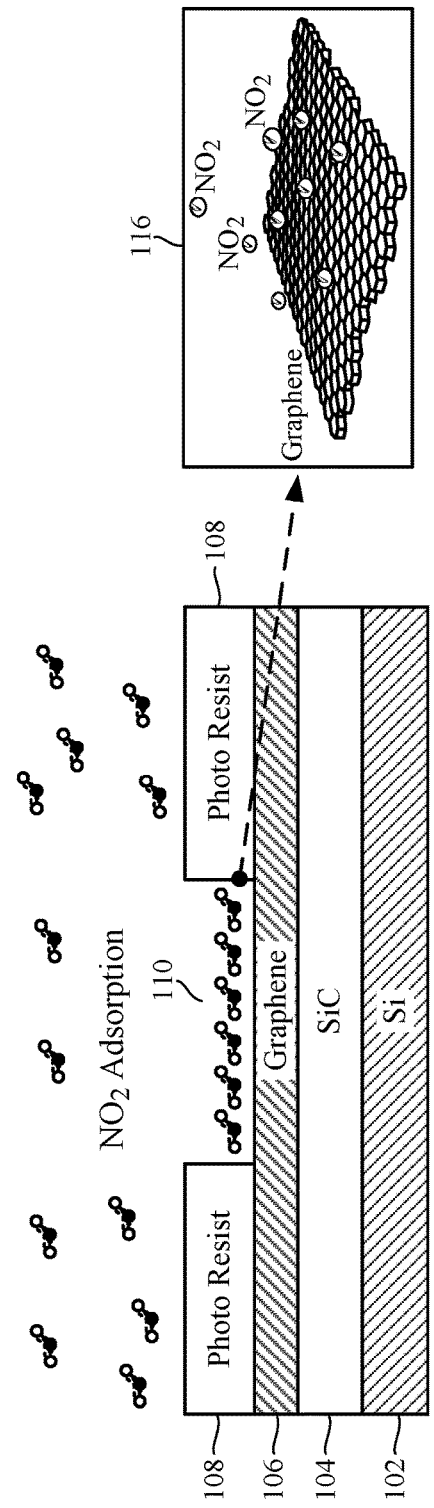

Referring to FIG. 6, a nitrogen dioxide ($NO_2$) layer 110 may then be formed in a channel region above the graphene layer 106. In particular, according to various aspects, the $NO_2$ layer 110 may be formed using selective $NO_2$ adsorption, wherein a photoresist 108 can be developed on the graphene layer 106 in a source region and a drain region, wherein the photoresist 108 may comprise poly(methyl methacrylate) (PMMA), poly(methyl glutarimide) (PMGI), and/or any other suitable material that can be used to form a patterned coating over the graphene layer 106 in the source region and the drain region (e.g., a pattern having a width that corresponds to a desired width for the source and the drain of the graphene NMOS transistor being formed). Accordingly, as shown in FIG. 6, the photoresist 108 is not formed over the graphene layer 106 in the channel region such that $NO_2$ can be selectively adsorbed on the graphene layer 106 surface within the channel region, thereby creating the adsorbed the $NO_2$ layer 110. For example, as depicted at 116, the adsorbed the $NO_2$ layer 110 may adhere to the surface of the graphene layer 106 in the channel region and thereby form an $NO_2$ "adsorbate" film on the "adsorbent" surface of the graphene layer 106.

Figure 7:
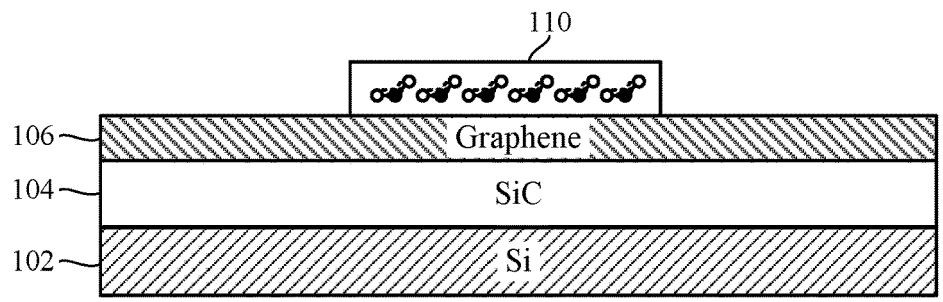
Figure 8:
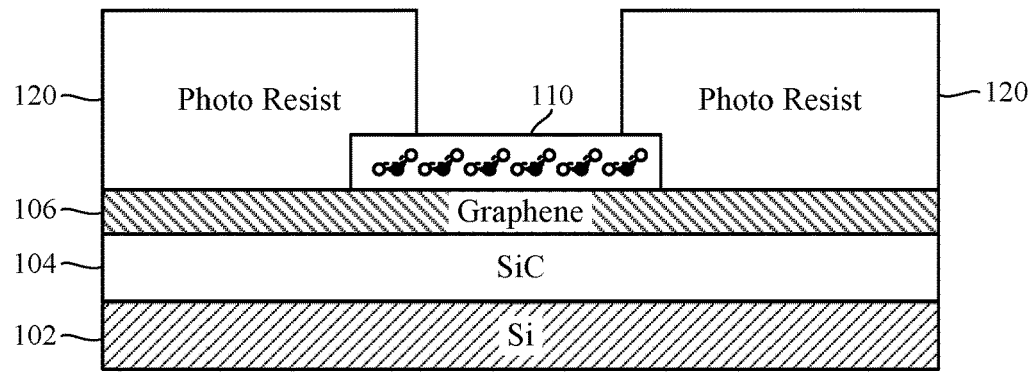
Figure 9:
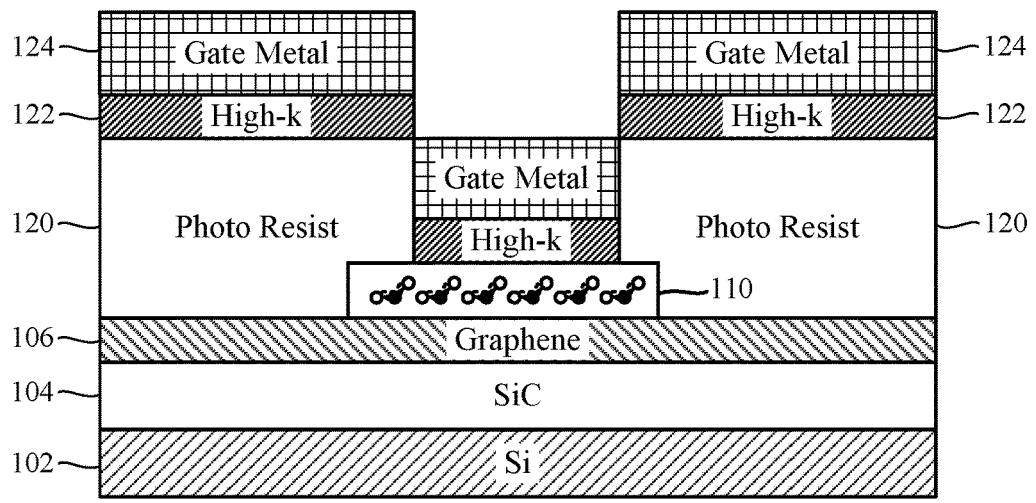
Figure 10:
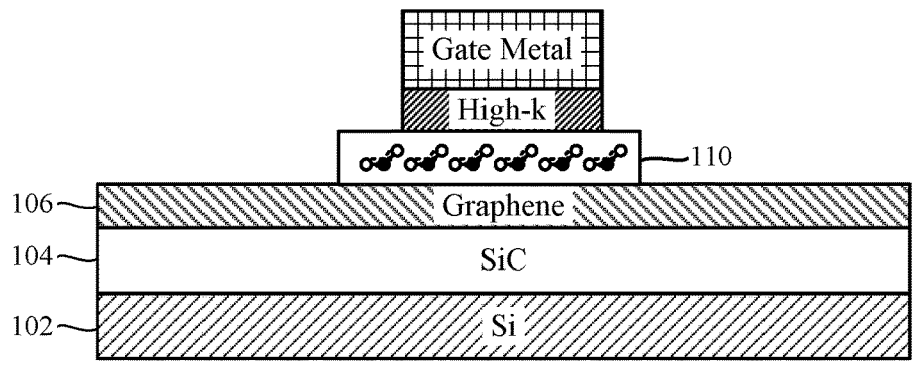

In various embodiments, once the $NO_2$ layer 110 has been suitably formed, the photoresist 108 is then removed (e.g., via dissolving in a solvent), thereby resulting in the structure shown in FIG. 7. At that point, as shown in FIG. 8, a photoresist 120 can again be developed on the graphene layer 106 in the source region and the drain region, except that the photoresist 120 shown in FIG. 8 is further developed in a pattern that has a greater width than the desired source and drain width such that the photoresist 120 partially covers lateral portions of the $NO_2$ layer 110. As shown in FIG. 9, a gate stack can then be formed, wherein the gate stack may comprise a high-k dielectric 122 (e.g., hafnium silicate, zirconium silicate, hafnium dioxide, zirconium dioxide, etc.) and a gate metal 124, which may comprise tantalum (Ta), tantalum nitride (TaN), niobium (Nb), or another suitable metal. As shown in FIG. 8, the high-k dielectric 122 and the gate metal 124 may be deposited over the photoresist 120 in the source region and the channel region and over the $NO_2$ layer 110 in the channel region. As such, in addition to having the ability to attract electrons from the graphene layer 106 during operation, the $NO_2$ layer 110 may provide a buffer layer to protect the graphene layer 106 from damage that could otherwise occur while depositing the high-k dielectric 122.

According to various embodiments, a lift-off process may then be performed to remove the photoresist 120, the high-k dielectric 122, and the gate metal 124 in the source region and the drain region. For example, the lift-off process generally refers to a process to create a target material on a surface using a sacrificial material (e.g., the photoresist 120), which is deposited in an inverse pattern and removed in the area where the target material is to be located (e.g., in the channel region where the high-k dielectric 122 and the gate metal 124 is to be located). As such, the high-k dielectric 122 and the gate metal 124 is deposited on the entire surface, including the photoresist 120 remaining in the source region and the drain region and the channel region where the photoresist 120 was removed to leave the $NO_2$ layer 110 exposed. After the high-k dielectric 122 and the gate metal 124 has been deposited on the entire surface, the remaining photoresist 120 may be removed (e.g., dissolved in a solvent) together with the high-k dielectric 122 and the gate metal 124 deposited thereon, such that only the high-k dielectric 122 and the gate metal 124 deposited on the exposed $NO_2$ layer 110 remains, thereby resulting in the structure shown in FIG. 10.

Figure 11:
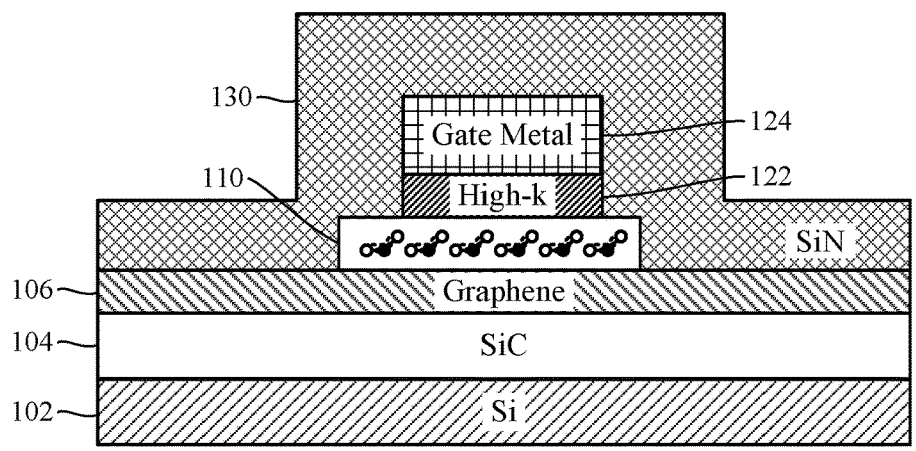
Figure 12:
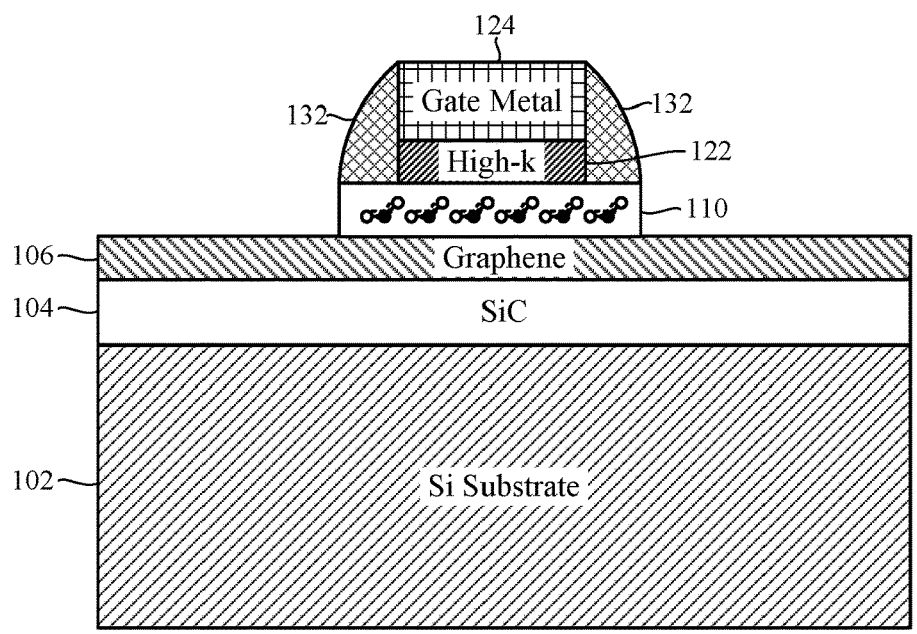

According to various embodiments, as shown in FIG. 11, a silicon nitride (SiN) layer 130 may then be deposited on the entire surface and an etching process may then be used to form spacers 132 above the $NO_2$ layer 110 and adjacent to the gate stack formed from the high-k dielectric 122 and the gate metal 124, thereby resulting in the structure shown in FIG. 12. For example, in various embodiments, a dry-etching (or plasma-etching) process can be used, whereby a source gas rich in chlorine or fluorine (e.g. trifluoromethane) is used to remove the silicon nitride (SiN) layer 130 except the parts will form the spacers 132 above the $NO_2$ layer 110 and adjacent to the gate stack. However, those skilled in the art will appreciate that other suitable processes can be used to remove the parts of the silicon nitride (SiN) layer 130 that will not be used to form the SiN spacers 132 above the $NO_2$ layer 110.

Figure 13:
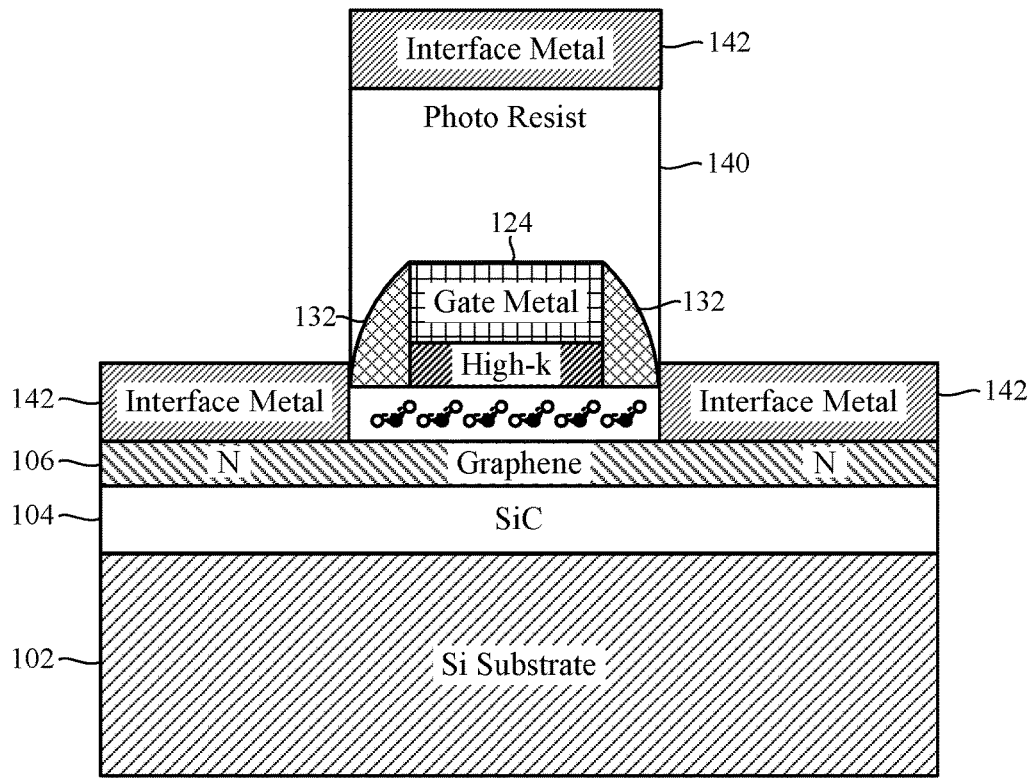
Figure 14:
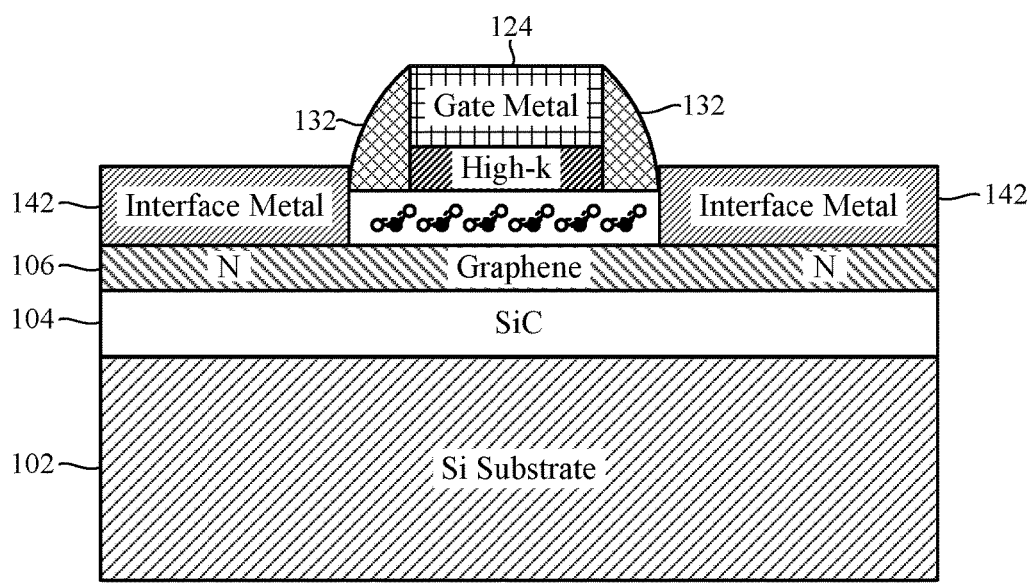

In various embodiments, once the SiN spacers 132 have been suitably formed, another lift-off process may be used to form an interface metal 142 in the source region and the drain region. More particularly, as shown in FIG. 13, a photoresist 140 may be developed in the channel region to cover the SiN spacers 132 and the gate metal 124 used in the gate stack, thereby exposing only the graphene layer 106 the source region and the drain region. The interface metal 142 may then be formed on the graphene layer 106 in the source region and the drain region and on the photoresist 140 in the channel region. The photoresist 140 developed in the channel region can then be removed together with the interface metal 142 that was deposited in the channel region such that only the interface metal 142 deposited in the source region and the drain region remains, thereby resulting in the structure shown in FIG. 14.

Figure 15:
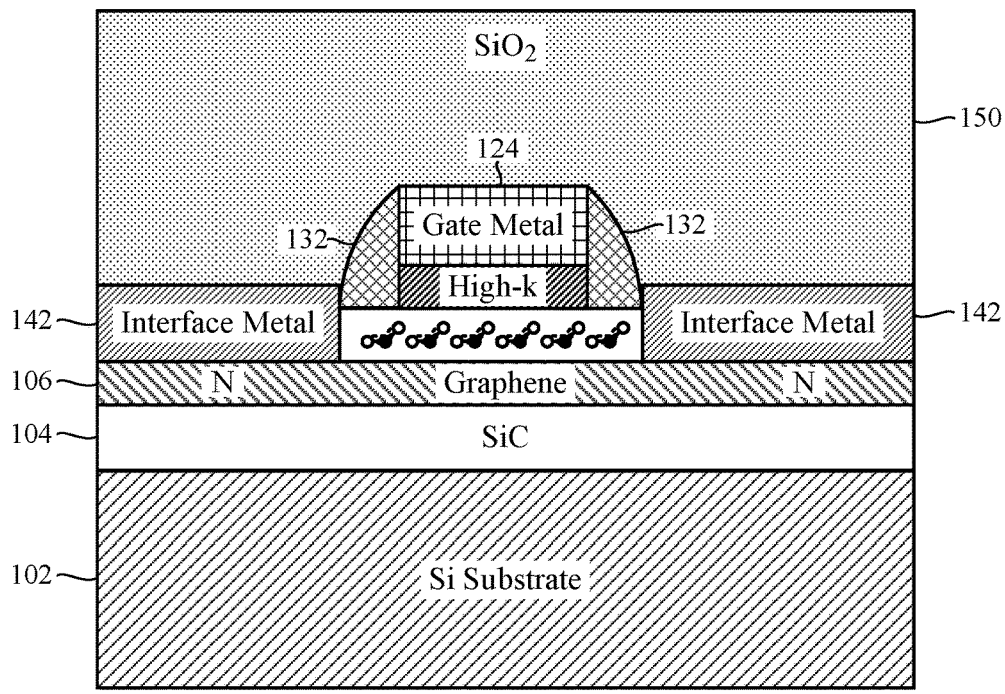
Figure 16:
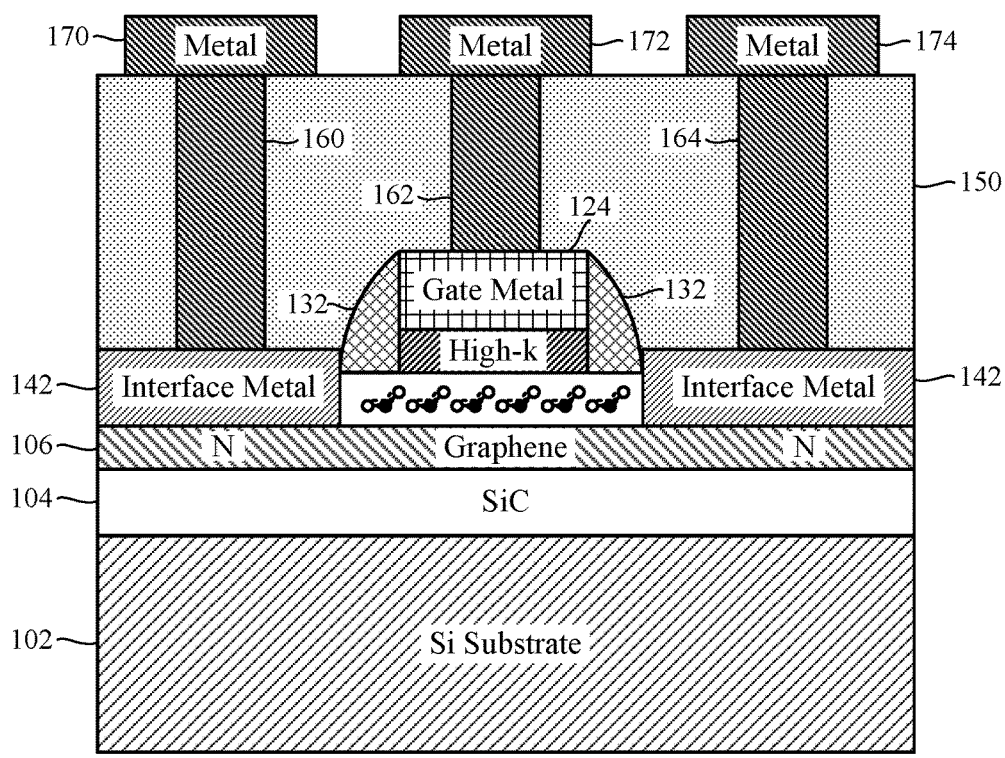
Figure 17:
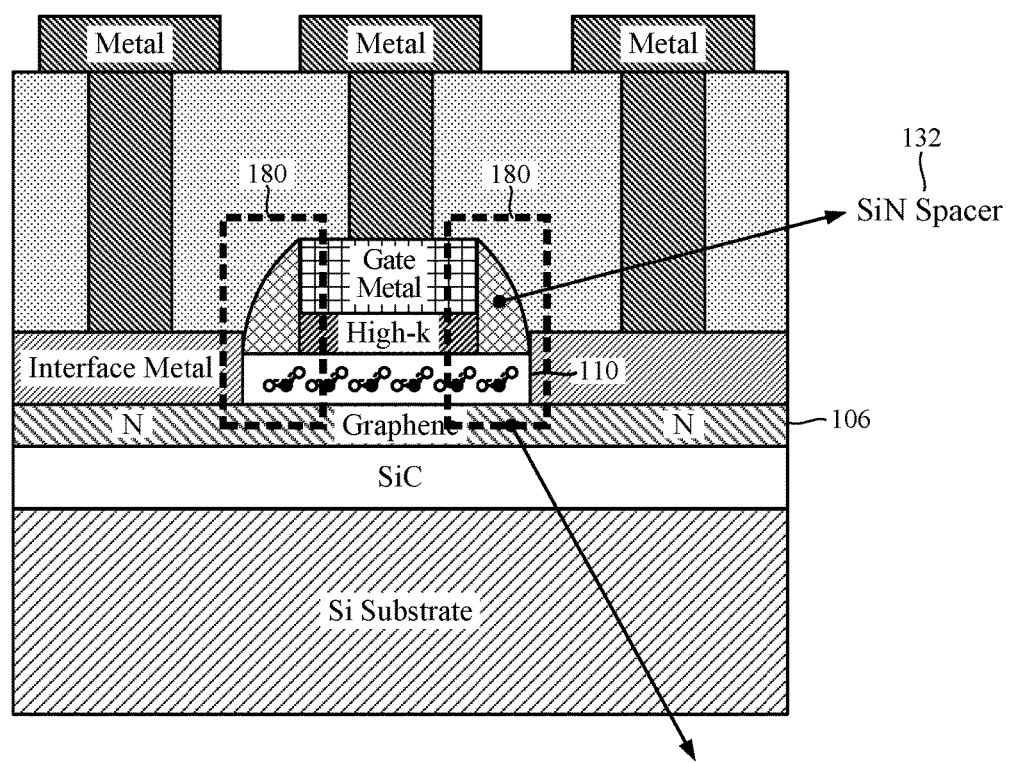
FIG. 17 and FIG. 18 illustrate exemplary effects from using $NO_2$ chemical adsorption to form the graphene NMOS transistor, according to various aspects.
Figure 18:
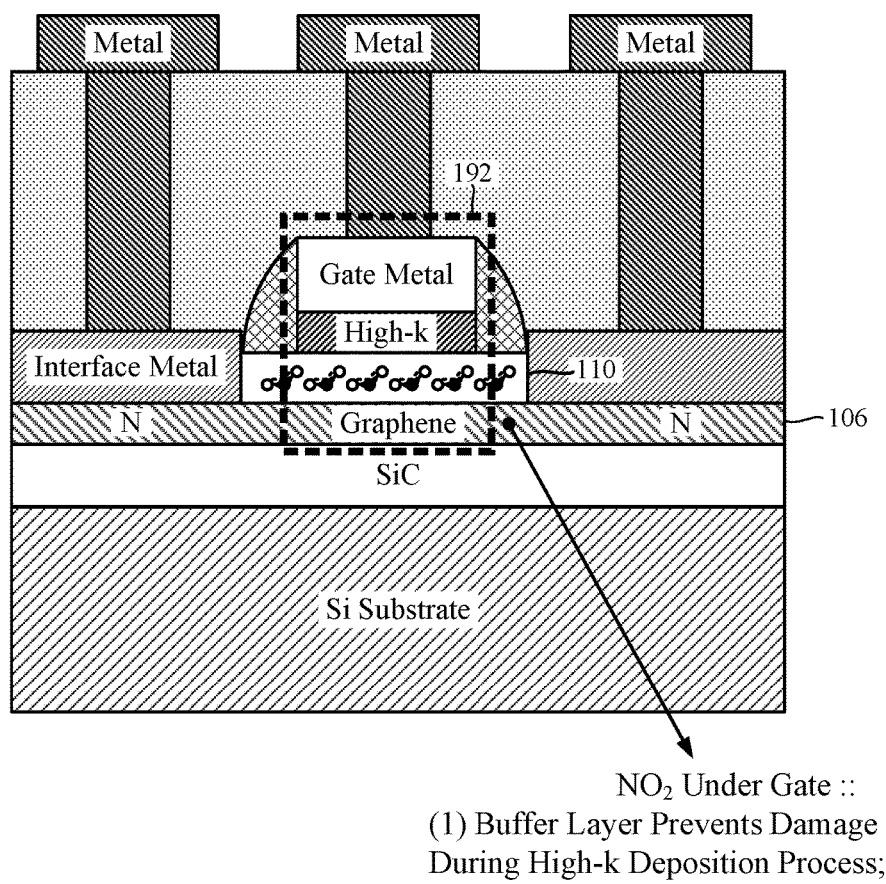

As shown in FIG. 15, a silicon dioxide ($SiO_2$) layer 150 may then be deposited over the interface metal 142 in the source region and the drain region and the gate metal 124 and the SiN spacers 132 in the channel region 124, thereby forming interlayer dielectrics. In various embodiments, as shown in FIG. 16, interconnects 160, 162, 164 may then be formed through interlayer dielectrics 150 to connect a source electrode 170 to the interface metal 142 in the source region, a gate electrode 172 to the gate metal 124 in the channel region, and a drain electrode 174 to the interface metal 142 in the drain region, resulting in the final graphene NMOS transistor with the chemically adsorbed $NO_2$ layer 110 disposed between the graphene layer 106 and the gate stack in the channel region and below the SiN spacers 132 in the channel region. For example, as depicted in FIG. 17 at 180, the chemically adsorbed $NO_2$ layer 110 disposed under the SiN spacers 132 can act as a strong electron acceptor to make the graphene layer 106 electron-deficient and create bandgap energy in the channel region without scattering electrons or disrupting the lattice structure in the graphene layer 106. In contrast, without the $NO_2$ layer 110 under the SiN spacers 132, leakage current could result due to the short channel length (e.g., related to the drain-induced barrier lowering (DIBL)). Further, as depicted in FIG. 18 at 192, forming the chemically adsorbed $NO_2$ layer 110 under the gate stack may prevent damage to the graphene layer 106 that could otherwise occur when depositing the high-k dielectric 122 in the gate stack.

Figure 19:
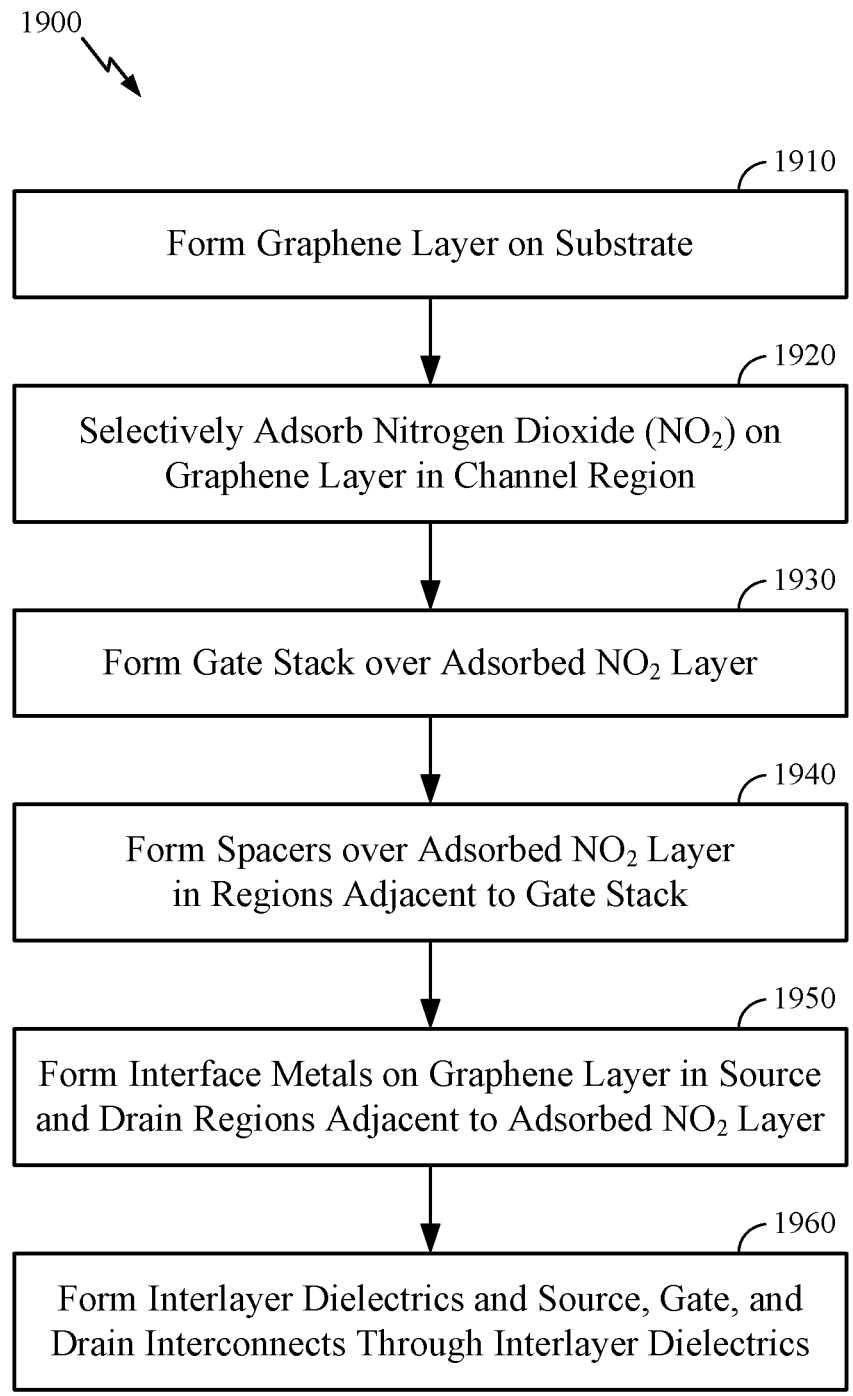
FIG. 19 illustrates an exemplary method to form the graphene NMOS transistor using $NO_2$ chemical adsorption, according to various aspects.

According to various aspects, FIG. 19 illustrates an exemplary method 1900 to form the graphene NMOS transistor described in further detail above. In particular, according to various embodiments, the method 1900 may comprise forming a graphene layer on a substrate at block 1910, wherein the substrate may comprise a silicon substrate having a silicon carbide (SiC) surface. For example, in various embodiments, forming the graphene layer at block 1910 may be epitaxially formed on the SiC surface through thermal annealing at high temperatures in a high vacuum or an inert gas atmosphere, wherein the SiC surface may contain Si-terminated and C-terminated faces. As such, at block 1910, the graphene layer may epitaxially grown on the Si face to form the graphene layer with a homogeneous and clean lattice structure that may enable greater carrier mobilities. However, those skilled in the art will appreciate that any suitable technique may be used to form the graphene layer on the substrate.

In various embodiments, at block 1920, nitrogen dioxide ($NO_2$) layer may then be selectively adsorbed on the graphene layer in a channel region. For example, in various embodiments, block 1920 may comprise developing a photoresist on the graphene layer in a source region and a drain region according to a pattern having a width that corresponds to a desired width for the source and the drain of the graphene NMOS transistor being formed. Accordingly, at block 1920, the photoresist may not be formed over the portion of the graphene layer disposed in the channel region such that the $NO_2$ layer can be selectively adsorbed on the graphene layer surface within the channel region to thereby create the adsorbed the $NO_2$ layer, which may adhere to the surface of the graphene layer in the channel region and thereby form an "adsorbate" film on the "adsorbent" surface of the graphene layer.

In various embodiments, at block 1930, a gate stack may then be formed over a portion of the adsorbed $NO_2$ layer. In particular, forming the gate stack may comprise removing the photoresist that was developed to form the adsorbed $NO_2$ layer and developing another photoresist on the portion of the graphene layer disposed in the source region and the drain region. As such, the photoresist developed at block 1930 may be developed in a pattern that has a greater width than the desired source and drain width such that the photoresist partially covers lateral portions of the $NO_2$ layer. The gate stack can then be formed from a high-k dielectric and a gate metal, which may be deposited over the photoresist developed in the source region and the channel region and over a portion of the $NO_2$ layer in the channel region. As such, in addition to having the ability to attract electrons from the graphene layer during operation, the adsorbed $NO_2$ layer formed at block 1920 may provide a buffer layer to protect the graphene layer from damage that could otherwise occur while depositing the high-k dielectric when forming the gate stack at block 1930. In various embodiments, a lift-off process may then be performed to remove the photoresist as well as the high-k dielectric and the gate metal that was deposited in the source region and the drain region. For example, as described in further detail above, the lift-off process may comprise depositing the sacrificial photoresist material in an inverse pattern and then removing the photoresist material in the area where the high-k dielectric and the gate metal is to be located. As such, the high-k dielectric and the gate metal is deposited on the entire surface, including over the remaining photoresist in the source region and the drain region and in the portion of the channel region where the photoresist was removed to leave the $NO_2$ layer exposed. After the high-k dielectric and the gate metal are deposited on the entire surface, the remaining photoresist may be removed together with the high-k dielectric and the gate metal deposited thereon, such that only the high-k dielectric and the gate metal deposited on the exposed $NO_2$ layer remains, thereby resulting in the gate stack formation over the adsorbed $NO_2$ layer.

In various embodiments, at block 1940, spacers may then be formed over the adsorbed $NO_2$ layer in regions adjacent to the gate stack. For example, in various embodiments, forming the spacers may comprise depositing a silicon nitride (SiN) layer on the entire surface and then performing an etching process to form the spacers above the $NO_2$ layer and adjacent to the gate stack that was formed at block 1930. For example, in various embodiments, the etching process may be used to remove the SiN layer except for those parts that will form the spacers disposed above the $NO_2$ layer adjacent to the gate stack. In various embodiments, at block 1950, another lift-off process may be used to form an interface metal in the source region and the drain region. For example, the lift-off process performed at block 1950 may comprise developing another photoresist in the channel region to cover the spacers that were formed at block 1940 and the gate metal used in the gate stack that was formed at block 1930, thereby exposing only the portion of the graphene layer disposed in the source region and the drain region. The interface metal may then be formed on the exposed portion of the graphene layer disposed in the source region and the drain region and on the photoresist developed within the channel region. The photoresist developed in the channel region can then be removed together with the interface metal deposited in the channel region such that only the interface metal deposited in the source region and the drain region remains.

In various embodiments, at block 1960, a silicon dioxide ($SiO_2$) layer may then be deposited over the interface metal formed in the source and drain regions and over the gate metal and the SiN spacers formed in the channel region, thereby forming interlayer dielectrics. In various embodiments, interconnects may then be formed through interlayer dielectrics to connect a source electrode to the interface metal formed in the source region, a gate electrode to the gate metal formed in the channel region, and a drain electrode to the interface metal formed in the drain region, resulting in the final graphene NMOS transistor with the chemically adsorbed $NO_2$ layer disposed between the graphene layer and the gate stack in the channel region and below the SiN spacers in the channel region. As such, the chemically adsorbed $NO_2$ layer disposed under the SiN spacers can act as a strong electron acceptor to make the graphene layer electron-deficient and create bandgap energy in the channel region without scattering electrons or disrupting the lattice structure in the graphene layer.

According to various aspects, the graphene NMOS transistor having a chemically adsorbed $NO_2$ layer formed in a channel region as described herein may be provided in, integrated into, or otherwise implemented in any suitable integrated circuit and/or processor-based device that comprises one or more integrated circuits that implement the graphene NMOS transistor described herein, which may include, without limitation, a microprocessor-based integrated circuit, system, or other suitable electronic device(s). For example, processor-based electronic devices that can include or otherwise employ the graphene NMOS transistor described herein can comprise mobile phones, cellular phones, computers, portable computers, desktop computers, personal digital assistants (PDAs), monitors, computer monitors, televisions, tuners, radios, satellite radios, digital music players, portable music players, digital video players, digital video disc (DVD) players, portable digital video players, or the like.

Figure 20:
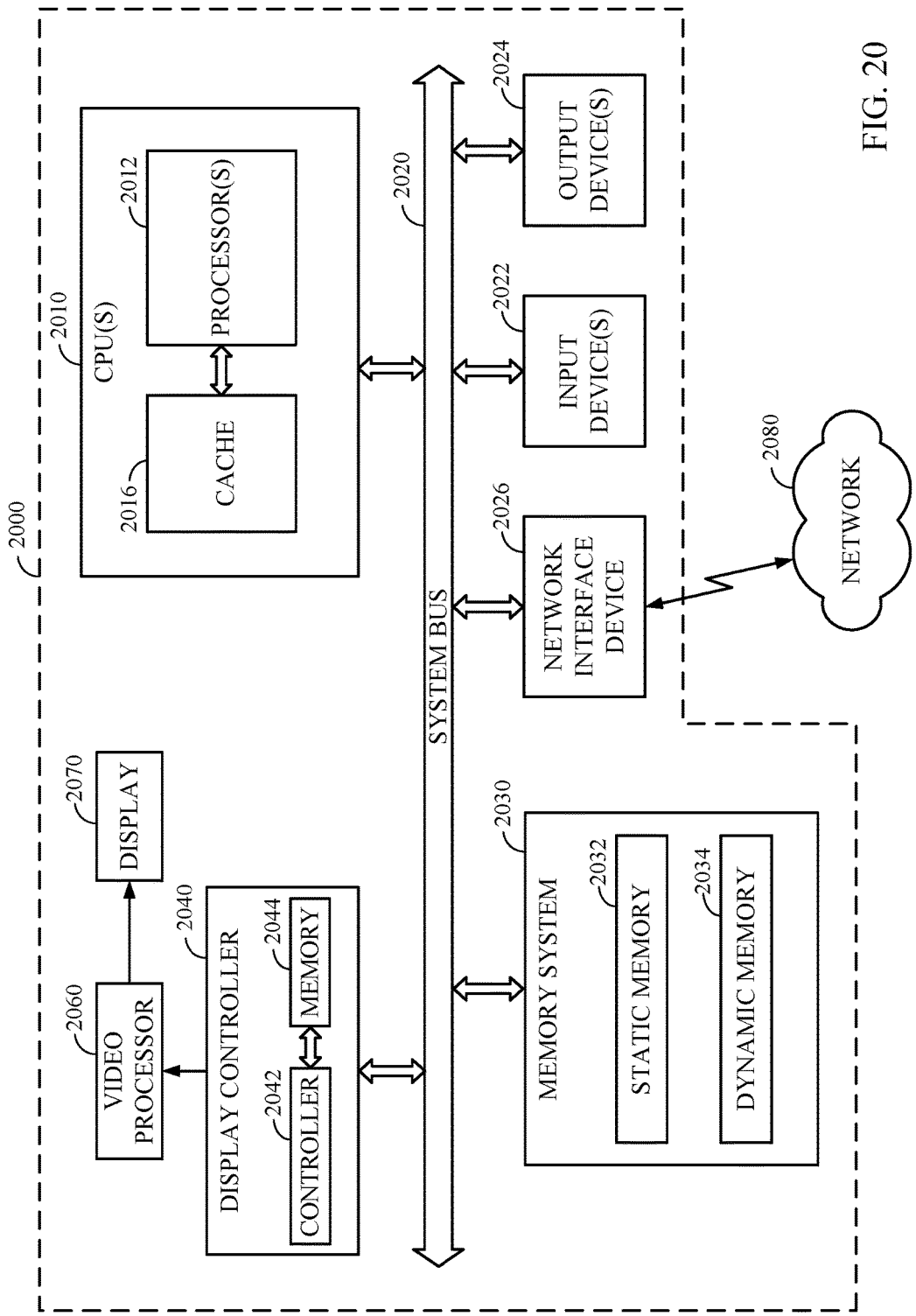
FIG. 20 illustrates an exemplary processor-based system that may comprise one or more integrated circuits that implement the graphene NMOS transistor described herein, according to various aspects.

For example, according to various aspects, FIG. 20 illustrates an example processor-based system 2000 that may have one or more integrated circuits implementing the graphene NMOS transistor described in further detail above. In various embodiments, the processor-based system 2000 may include one or more central processing units (CPUs) 2010, which may each include one or more processors 2012. The CPU(s) 2010 may have a cache memory 2016 coupled to the processor(s) 2012 to rapidly access temporarily stored data. The CPU(s) 2010 can be further coupled to a system bus 2020, which can intercouple various master devices and slave devices included in the processor-based system 2000. Furthermore, as would be apparent to those skilled in the art, the CPU(s) 2010 may exchange address, control, and data information over the system bus 2020 to communicate with these other devices. For example, the CPU(s) 2010 can communicate bus transaction requests to a memory system 2030. Although not explicitly illustrated in FIG. 20, multiple system buses 2020 could be provided, wherein each system bus 2020 may constitute a different fabric.

According to various aspects, other devices can also be connected to the system bus 2020. For example, as illustrated in FIG. 20, the devices connected to the system bus 2020 can include the memory system 2030, one or more input devices 2022, one or more output devices 2024, one or more network interface devices 2026, and one or more display controllers 2040, as examples. The input device(s) 2022 can include any type of input device, including but not limited to input keys, switches, voice processors, etc. The output device(s) 2024 can include any type of output device, including but not limited to audio, video, other visual indicators, etc. The network interface device(s) 2026 can be any devices configured to allow exchange of data to and from a network 2080. The network 2080 can be any type of network, including but not limited to a wired or wireless network, private or public network, a local area network (LAN), a wide local area network (WLAN), and the Internet. The network interface device(s) 2026 can be configured to support any type of communication protocol desired. The memory system 2030 can include static memory 2032 and/or dynamic memory 2034.

According to various aspects, the CPU(s) 2010 may also be configured to access the display controller(s) 2040 over the system bus 2020 to control information sent to one or more displays 2070. The display controller 2040 can include a memory controller 2042 and a memory 2044 to store data to be sent to the display(s) 2070 in response to communications with the CPU(s) 2010. As such, the display controller(s) 2040 may send information to the display(s) 2070 to be displayed via one or more video processors 2060, which may process the information to be displayed into a format suitable for the display(s) 2070. The display(s) 2070 can include any type of display, including but not limited to a cathode ray tube (CRT), a liquid crystal display (LCD), a plasma display, etc.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects and embodiments described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The methods, sequences and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an IoT device. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes CD, laser disc, optical disc, DVD, floppy disk, and Blu-ray discs, which usually reproduce data magnetically and/or optically with lasers. Combinations of the above should also be included within the scope of computer-readable media.

While the foregoing disclosure shows illustrative aspects and embodiments, those skilled in the art will appreciate that various changes and modifications could be made herein without departing from the scope of the disclosure as defined by the appended claims. The functions, steps and/or actions of the method claims in accordance with the aspects and embodiments described herein need not be performed in any particular order. Furthermore, although elements may be described above or claimed in the singular, the plural is contemplated unless limitation to the singular is explicitly stated.

What is claimed is:

1. An n-type metal-oxide-semiconductor (NMOS) transistor, comprising:
   a substrate having a graphene layer formed on a topmost surface;
   a source terminal formed on the graphene layer in a source region;
   a drain terminal formed on the graphene layer in a drain region;
   a gate stack formed on the graphene layer within a channel region disposed between the source terminal and the drain terminal, wherein the channel region comprises a spacer region and the gate stack comprises:
      a high-k dielectric layer;
      an adsorbed nitrogen dioxide ($NO_2$) layer formed on an adsorbent surface of the graphene layer in the channel region, the absorbed $NO_2$ layer in contact with the source terminal and the drain terminal and forming an adsorbate film between the high-k dielectric layer and the adsorbent surface of the graphene layer; and
      a gate metal formed over the high-k dielectric layer.

2. The NMOS transistor recited in claim 1, wherein the adsorbed $NO_2$ layer is further disposed between the spacer region and the graphene layer.

3. The NMOS transistor recited in claim 1, wherein the adsorbed $NO_2$ layer is configured to attract electrons from the graphene layer within the channel region to make the graphene layer electron-deficient in the channel region.

4. The NMOS transistor recited in claim 3, wherein the source terminal is an n-type source terminal and the drain terminal is an n-type drain terminal such that the n-type source terminal, the electron-deficient graphene layer in the channel region, and the n-type drain terminal form an N-P-N transistor.

5. The NMOS transistor recited in claim 4, wherein the N-P-N transistor has substantially no leakage current at a gate voltage ($V_g$) equal to zero.

6. The NMOS transistor recited in claim 4, wherein the graphene layer has a doping concentration ($N_D$) equal to zero such that electron mobility ($\mu_n$) through the graphene layer is maximized and the N-P-N transistor has a ratio between an on current ($I_{on}$) and on off current ($I_{off}$) suitable for digital logic applications.

7. The NMOS transistor recited in claim 1, further comprising:
 a first spacer formed in the spacer region adjacent to a first sidewall of the gate stack; and
 a second spacer formed in the spacer region adjacent to a second sidewall of the gate stack, wherein the adsorbed $NO_2$ layer is disposed under the first spacer and the second spacer to reduce potential short-channel effects related to drain-induced barrier lowering (DIBL).

8. The NMOS transistor recited in claim 7, wherein the first spacer and the second spacer are formed from silicon nitride (SiN).

9. The NMOS transistor recited in claim 1, wherein the topmost surface of the substrate is formed from silicon carbide (SiC).

10. The NMOS transistor recited in claim 1, further comprising:
 interlayer dielectrics formed over the channel region, the source terminal in the source region, and the drain terminal in the drain region; and
 interconnects formed through the interlayer dielectrics to connect the source terminal to a source electrode, the gate metal to a gate electrode, and the drain terminal to a drain electrode.

11. A field-effect transistor, comprising:
 a source terminal, a drain terminal, and a gate;
 a graphene channel having an adsorbent surface with a nitrogen dioxide adsorbate film formed thereon, the nitrogen dioxide adsorbate film in contact with the source terminal and the drain terminal and forming an adsorbate film disposed under the gate between a high-k dielectric layer and the adsorbent surface of the graphene channel; and
 means for flowing electrons through the graphene channel, wherein:
  the nitrogen dioxide adsorbate film is configured to attract the electrons flowed through the graphene channel such that the field-effect transistor turns off at a gate voltage ($V_g$) equal to zero, and
  the graphene channel has a doping concentration ($N_D$) equal to zero such that the electrons flowed through the graphene channel have a maximum possible mobility ($\mu$).

12. The field-effect transistor recited in claim 11, further comprising:
 a first spacer structure located in a first spacer region above the nitrogen dioxide adsorbate film and between the source terminal and the gate; and
 a second spacer structure located in a second spacer region above the nitrogen dioxide adsorbate film and between the drain terminal and the gate.

* * * * *